United States Patent
Roohparvar

(10) Patent No.: US 7,535,759 B2
(45) Date of Patent: May 19, 2009

(54) MEMORY SYSTEM WITH USER CONFIGURABLE DENSITY/PERFORMANCE OPTION

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 326 days.

(21) Appl. No.: 10/861,645

(22) Filed: Jun. 4, 2004

(65) Prior Publication Data

US 2005/0273548 A1    Dec. 8, 2005

(51) Int. Cl.
  G11C 11/34   (2006.01)
  G06F 12/00   (2006.01)
(52) U.S. Cl. ............... 365/185.03; 365/185.11; 711/103; 711/170; 711/173
(58) Field of Classification Search .............. None
  See application file for complete search history.

(56) References Cited

U.S. PATENT DOCUMENTS

| | | | |
|---|---|---|---|
| 5,237,689 A * | 8/1993 | Behnke | 713/1 |
| 6,167,482 A * | 12/2000 | Schmidt et al. | 711/103 |
| 6,349,395 B2 | 2/2002 | Ohuchi | |
| 6,493,260 B2 * | 12/2002 | Micheloni et al. | 365/185.03 |
| 6,536,038 B1 * | 3/2003 | Ewertz et al. | 717/168 |
| 6,662,285 B1 | 12/2003 | Sastry | |
| 2001/0038553 A1 * | 11/2001 | Parker et al. | 365/185.03 |
| 2002/0057595 A1 * | 5/2002 | Kobayashi et al. | 365/185.03 |

* cited by examiner

*Primary Examiner*—Hyung S Sough
*Assistant Examiner*—Kaushikkumar Patel
(74) *Attorney, Agent, or Firm*—Leffert Jay & Polglaze, P.A.

(57) ABSTRACT

The memory system has one or more memory dies coupled to a processor or other system controller. Each die has a separate memory array organized into multiple memory blocks. The different memory blocks of each die can be assigned a different memory density by the end user, depending on the desired memory performance and/or memory density. The user configurable density/performance option can be adjusted with special read/write operations or a configuration register having a memory density configuration bit for each memory block.

41 Claims, 5 Drawing Sheets

MEMORY SYSTEM WITH USER CONFIGURABLE DENSITY/PERFORMANCE OPTION

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

The present trend of electronic devices is increased performance at reduced cost. The component manufacturers, therefore, must continue to increase the performance of their devices while decreasing the cost to manufacture them.

One way to increase a flash memory device's density while lowering its manufacturing cost is to use multiple level cells (MLC). Such a device stores two logical bits per physical cell. This reduces the overall cost of the memory. NAND flash memory devices are designed to operate in either one of two configurations on the same die: single bit per cell (SBC) or MLC. The selection of the configuration is done at the factory when the die is manufactured through a metal mask or a programmable fuse option.

However, an MLC die, while having improved cost versus density, has drawbacks relative to performance. Both the programming and read operations can become slower for an MLC die. Therefore, the user typically has to choose between having high memory density at low cost and lower memory density with higher performance.

For the reasons stated above, and for other reasons stated below which will become apparent to those skilled in the art upon reading and understanding the present specification, there is a need in the art for a memory system that combines the attributes of both MLC and SBC.

SUMMARY

The above-mentioned problems with memory density and performance and other problems are addressed by the present invention and will be understood by reading and studying the following specification.

The embodiments of the present invention encompass a memory system that has user selectable MLC and SBC options. The system may have multiple memory dies, each die having a separate memory array organized into multiple memory blocks. Different memory blocks can be assigned a different memory density.

The memory device is comprised of a processor for generating memory control signals. At least one flash memory device is coupled to the processor. The memory device has selectable density configurations.

The memory device has a memory array that includes a plurality of memory cells. Each memory cell is capable of storing a selectable quantity of data bits. The memory device additionally has control circuitry, coupled to the memory array, that controls the density configuration in response to a configuration command.

Further embodiments of the invention include methods and apparatus of varying scope.

DETAILED DESCRIPTION

Figure 1:
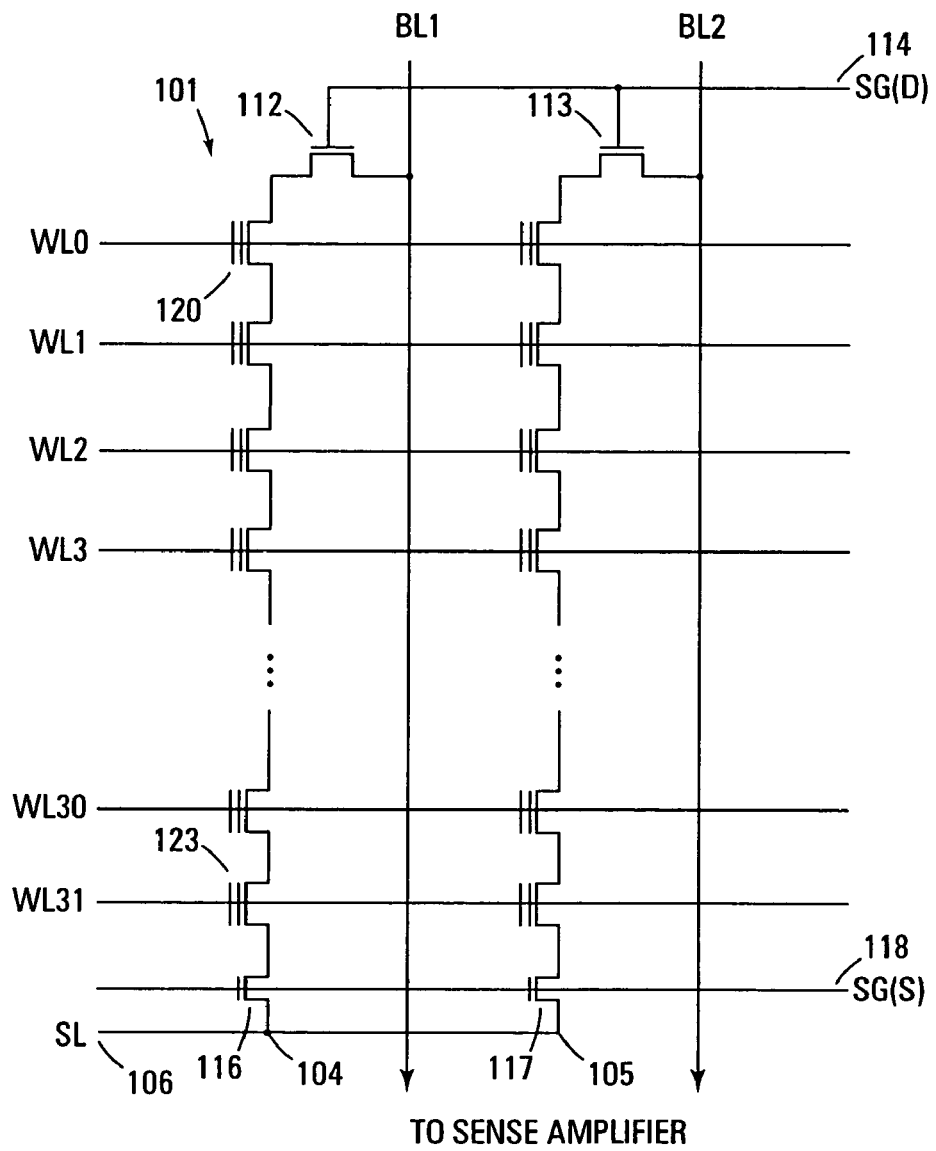
FIG. 1 shows a diagram of one embodiment of a NAND flash memory array of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a NAND flash array is comprised of an array of floating gate cells 101 arranged in series strings 104, 105. Each of the floating gate cells are coupled drain to source in the series chain 104, 105. Word lines (WL0-WL31) that span across multiple series strings 104, 105 are coupled to the control gates of every floating gate cell in order to control their operation. The memory array is arranged in row and column form such that the word lines (WL0-WL31) form the rows and the bit lines (BL1-BL2) form the columns.

In operation, the word lines (WL0-WL31) select the individual floating gate memory cells in the series chain 104, 105 to be written to or read from and operate the remaining floating gate memory cells in each series string 104, 105 in a pass through mode. Each series string 104, 105 of floating gate memory cells is coupled to a source line 106 by a source select gate 116, 117 and to an individual bit line (BL1-BL2) by a drain select gate 112, 113. The source select gates 116, 117 are controlled by a source select gate control line SG(S) 118 coupled to their control gates. The drain select gates 112, 113 are controlled by a drain select gate control line SG(D) 114.

The memory cells illustrated in FIG. 1 can be operated as either single bit cells (SBC) or multilevel cells (MLC). Multilevel cells greatly increase the density of a flash memory device. Such cells enable storage of multiple bits per memory cell by charging the floating gate of the transistor to different levels. MLC technology takes advantage of the analog nature of a traditional flash cell by assigning a bit pattern to a specific voltage range stored on the cell. This technology permits the storage of two or more bits per cell, depending on the quantity of voltage ranges assigned to the cell.

For example, a cell may be assigned four different voltage ranges of 200 mV for each range. Typically, a dead space or guard band of 0.2V to 0.4V is between each range. If the voltage stored on the cell is within the first range, the cell is storing a 00. If the voltage is within the second range, the cell is storing a 01. This continues for as many ranges are used for the cell.

The embodiments of the present invention may refer to the MLC as a high density configuration. The embodiments of the present invention are not limited to two-bits-per cell. Some embodiments may store more than two bits per cell, depending on the quantity of different voltage ranges that can be differentiated on the cell. Therefore, the term high density generally refers to any density beyond single bit cells.

Figure 2:
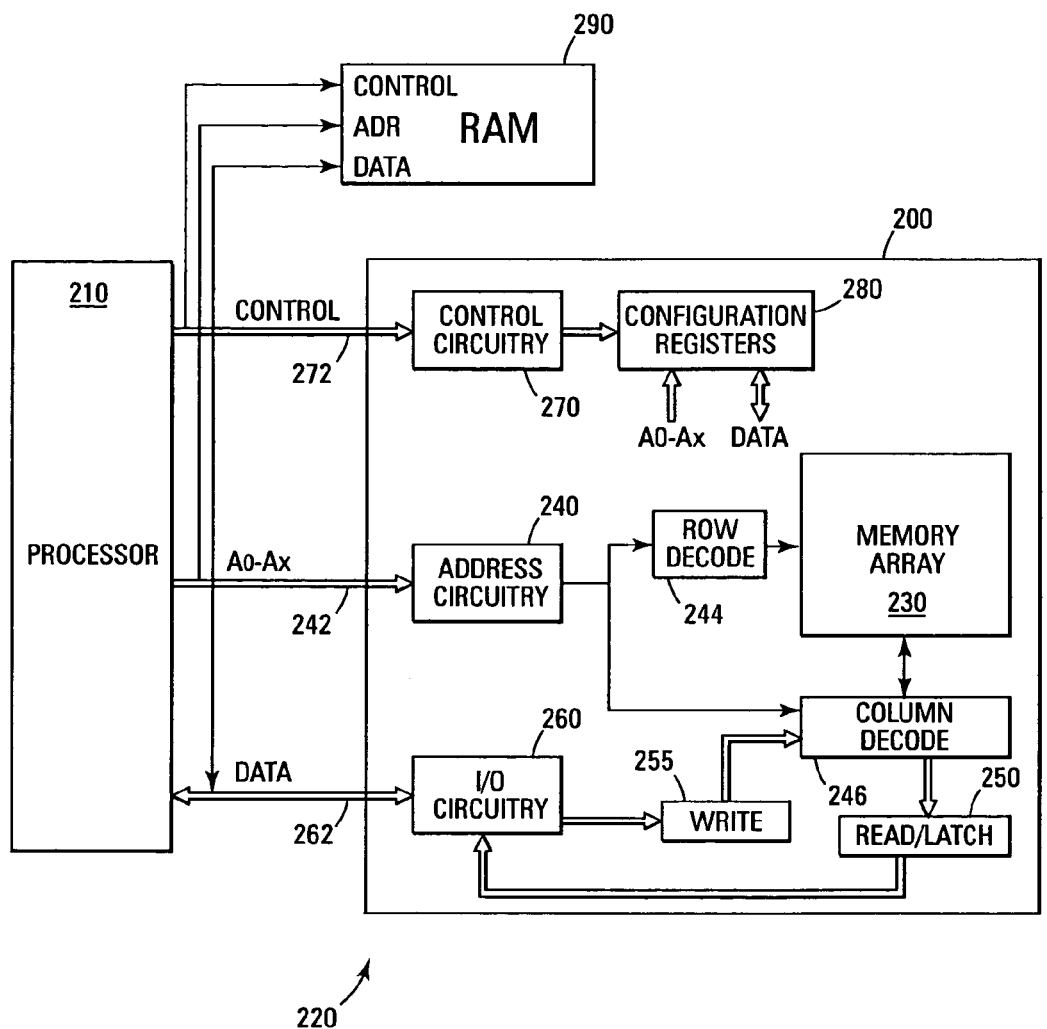
FIG. 2 shows a block diagram of one embodiment of a flash memory system of the present invention that incorporates the memory array of FIG. 1.

FIG. 2 illustrates a block diagram of one embodiment of a flash memory system 220 of the present invention that incorporates the memory array illustrated in FIG. 1. The memory device 200 has been simplified to focus on features of the memory that are helpful in understanding the present invention. A more detailed understanding of internal circuitry and functions of flash memories are known to those skilled in the art.

A processor 210 controls the operation of the flash memory system. The processor 210 may be a microprocessor, a microcontroller, or some other type of control circuitry that generates the memory control, data, and address signals required by the memory device 200.

The memory device 200 includes an array of flash memory cells 230 as discussed previously. An address buffer circuit 240 is provided to latch address signals provided on address input connections A0-Ax 242. Address signals are received and decoded by a row decoder 244 and a column decoder 246 to access the memory array 230. It will be appreciated by those skilled in the art, with the benefit of the present description, that the number of address input connections depends on the density and architecture of the memory array 230. That is, the number of addresses increases with both increased memory cell counts and increased bank and block counts.

The memory device 200 reads data in the memory array 230 by sensing voltage or current changes in the memory array columns using sense amplifier/buffer circuitry 250. The sense amplifier/buffer circuitry, in one embodiment, is coupled to read and latch a row of data from the memory array 230. Data input and output buffer circuitry 260 is included for bi-directional data communication over a plurality of data connections 262 with the controller 210. Write circuitry 255 is provided to write data to the memory array.

Control circuitry 270 decodes signals provided on a control bus 272. These signals are used to control the operations on the memory array 230, including data read, data write, and erase operations. The control circuitry 270 may be a state machine, a sequencer, or some other type of controller. The control circuitry 270, in one embodiment, is responsible for executing the embodiments of the methods of the present invention for configuring the memory blocks as high or single density.

The control circuitry 270 can also program the configuration registers 280 in which, in one embodiment, the high/single density memory configuration bits of the present invention can reside. This register may be a non-volatile, programmable fuse apparatus, a volatile memory array, or both. The configuration register 280 can also hold other data such as trimming data, memory block lock data, record keeping data for the memory device, and other data required for operation of the memory device.

In one embodiment, random access memory (RAM) 290 is included in the system 220 for volatile storage of data. The RAM 290 might be used to store memory density configuration data that is read from the non-volatile memory array 230 during initialization. In an embodiment where the system 220 is a memory card, the RAM 290 might be included on the card or coupled to the card through a back plane or other bus transmission structure.

The flash memory system illustrated in FIG. 2 can be implemented on a memory card, as a computer system, or any other type of non-volatile memory system requiring a system controller and non-volatile memory. Additional embodiments may include more than one memory device coupled to the processor. In such an embodiment, the processor could determine which blocks in the different flash memory devices would be assigned to have information stored in SBC or MLC. Such a system allows the end user to optimize for best performance, cost, and memory density depending on system use.

Figure 3:
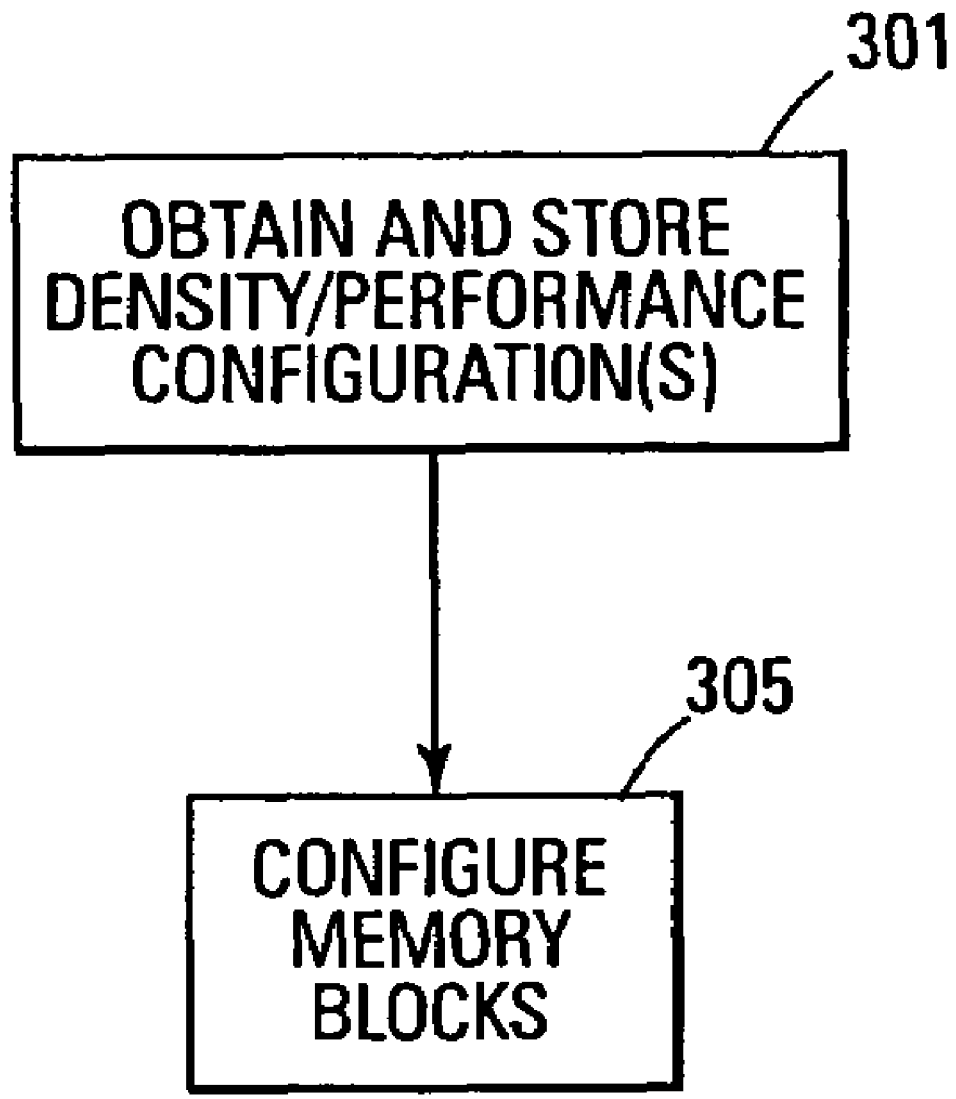
FIG. 3 shows a flowchart of one embodiment of a method for determining the desired density/performance configuration of the flash memory system.

FIG. 3 illustrates a flowchart of one embodiment of a method for determining the desired density/performance configuration of the memory system of FIG. 2. In one embodiment, the method begins when the system is powered up or otherwise initialized. As part of the initialization process or after the initialization process has been completed, the desired density/performance configurations for the flash memory in the system are obtained 301.

The desired density/performance configurations can be obtained in various ways, depending on the embodiment. A user can input some type of performance parameter that is used by the system to generate the memory block configurations of the present invention.

In one embodiment, the user provides the system with a desired average memory access speed performance parameter and the system determines the memory density required to obtain or come closest to that speed. For example, the processor may have an algorithm or table stored in memory (i.e., RAM or flash) that lists or determines the quantity of memory blocks that should be set to SBC and/or MLC in order to achieve an average access speed. Such an embodiment may require different flash memory dies of the system to have different quantities of memory blocks set to different densities. In the alternative, the user may just input that high access speed is desired. In this case, the system processor can set all of the flash memories to SBC.

In another embodiment, the user may input that a high reliability performance paramenter is important. In this case, the processor can set the flash memories to SBC in order to get the highest reliability possible. The processor can also set only certain blocks of each flash memory die or a certain quantity of entire flash memory dies to obtain the desired mean time before failure (MTBF) or other reliability indicator. The processor can access a table stored in non-volatile memory or RAM that indicates the required quantity of memory blocks that are set to SBC and/or MLC in order to achieve a predetermined MTBF or range of MTBFs. An algorithm or other means can also be used to determine the quantity of SBC/MLC blocks are required to achieve certain MTBFs.

In yet another embodiment, the user may input the planned use of the memory system and the system processor determines the best memory density necessary to meet that need. For example, if the memory system is a memory card and the user inputs that the card is to be used to store photographs, reliability is not as important as memory density and a predetermined quantity or all of the flash memory dies may be set to MLC. If the user is to use the memory card to store code, reliability is more important than density and all or a predetermined quantity of the flash memory dies are set to SBC.

After the memory density/performance configurations have been generated 301, the memory blocks of the flash memory die or dies are then configured 305. The configuration can be accomplished in many ways. Two embodiments for configuring the density/performance of flash memory are illustrated in FIGS. 4 and 5.

Figure 4:
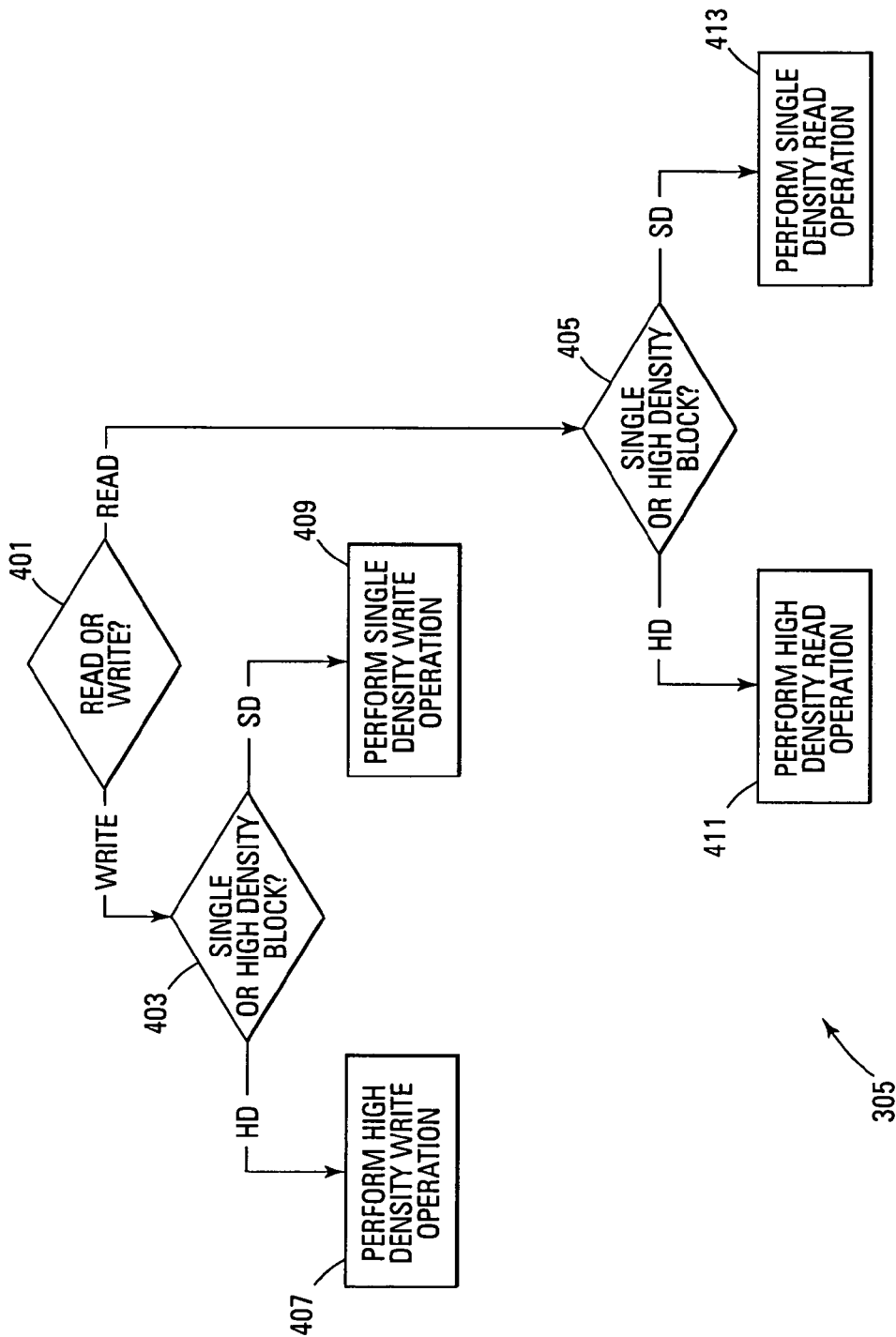
FIG. 4 shows a flowchart of one embodiment of a method for configuring the density/performance of the flash memory system.
Figure 5:
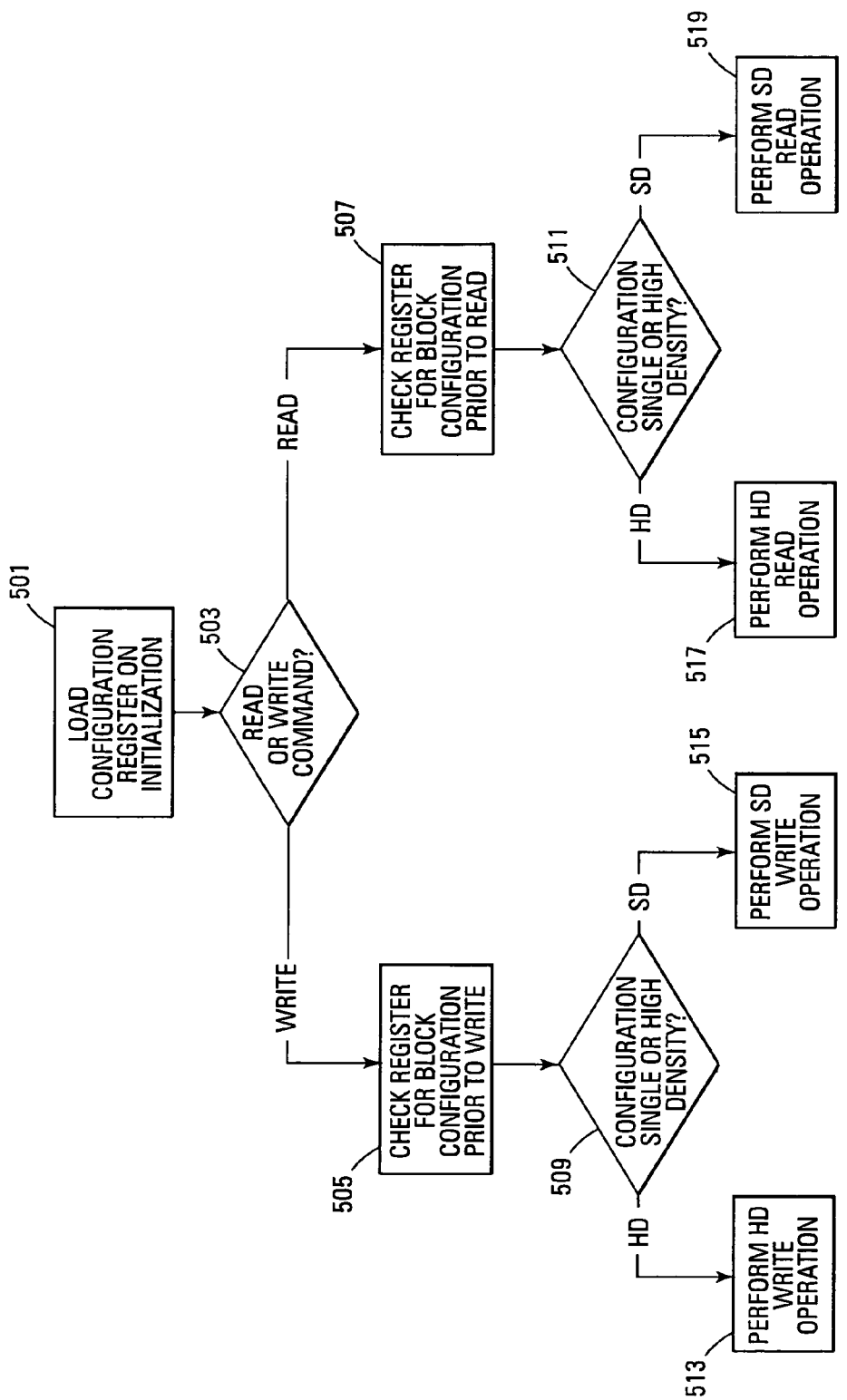
FIG. 5 shows a flowchart of another embodiment of a method for configuring the density/performance of the flash memory system.

FIG. 4 illustrates a flowchart of one embodiment of a method for configuring the density/performance of a memory device 305. This embodiment uses special write and read commands to perform high density program and read operations. This embodiment puts the burden on the memory control circuitry to determine the density/performance configuration for a particular block. By having the control circuitry perform this task, the memory device does not require any extra hardware in order to switch blocks between high density and single density. The controller tracks the density/performance level.

This embodiment uses two sets of algorithms—one for SBC reading and writing and another for MLC reading and writing. A higher level routine determines which set of algorithms to use depending on the received command. In this embodiment, the erase operation is substantially similar for each memory density.

The method determines if the received command is a read or write command 401. If a write command was received, it is determined 403 whether the command is a single density write command or a special high density write command. A high density write command 407 causes the controller circuitry to program the specified memory block with two or more bits per cell. A single density write command 409 causes the controller circuitry to program the specified memory block with one bit per cell.

If the received command is a read command, it is determined 405 whether the command is a single density read command or a high density read command. If the command is a high density read command 411, the memory block was previously programmed as an MLC cell and is, therefore, read with a high density read operation. A single density configuration read command causes the memory block to be read 413 assuming it was programmed as an SBC.

FIG. 5 illustrates another embodiment for configuring the density/performance of a memory device 305. In this embodiment, the SBC or MLC configuration is pre-assigned to blocks of memory using a configuration register. This could occur during or after system initialization. This embodiment uses flash memory read and write commands. Additionally, an existing register could be used to store the configuration data so that additional hardware is not required or, in another embodiment, a dedicated configuration register could be added to the memory device.

In one embodiment, the register of the present invention has a bit for every memory block for indicating the operating mode (e.g., MLC or SBC) of that particular block. For example, a logical 1 stored in the memory block 0 configuration bit would indicate that the block is an SBC block while a logical 0 would indicate the block is operating as an MLC block. In another embodiment, these logic levels are reversed.

Alternate embodiments can assign different quantities of blocks to each bit of the configuration register. For example, the register may have a configuration bit assigned to more than one memory block. Additionally, a configuration bit may be assigned to the sub-block level such that each block has multiple configuration bits.

In one embodiment, row 0 of the flash memory device of the present invention is a configuration row. At initialization and/or power-up of the device, the configuration data from row 0 is loaded into the configuration register 501.

When a command is received, it is determined whether it is a read or write command 503. For a read command, the configuration register is checked prior to the read operation to determine if the memory block has been assigned a high density or single density configuration 507. In a single density configuration 511, a single density read operation is performed 519. In a high density configuration 511, a high density read operation is performed 517.

If a write command was received, the configuration register is checked prior to write operation to determine if the memory block has been assigned a high density or a single density configuration 509. In a single density configuration 509, a single density write operation is performed 515. In a high density configuration 509, a high density write operation is performed 513.

In the embodiment of FIG. 5, the user determines the configuration of each block, or other memory cell grouping, and stores this data into the configuration register. When the memory device is powered down, the data in the configuration register is copied to row 0 for more permanent storage in non-volatile memory. In another embodiment, the user can store the configuration directly to the non-volatile, configuration row of the memory device.

The flash memory of the present invention is comprised of memory blocks that can each be configured to store data in different densities. For example, one use of a single memory device might be to store both pictures and code. The picture data is more tolerant of corrupted data than the storage of code. Therefore, since the SBC configuration has a higher reliability than the MLC configuration, the user would typically choose the SBC configuration for the code storage and the MLC configuration for the picture storage.

Similarly, since the MLC configuration might be eight to nine times slower in read and programming performance as compared to the SBC configuration, the user might choose the SBC configuration for memory blocks requiring faster read/write times. This could be useful in a system having fast bus speeds requiring fast storage and retrieval times.

CONCLUSION

In summary, the embodiments of the present invention enable a memory system user to select between an MLC and an SBC configuration. Different configurations can be set up for different memory blocks over multiple flash memory dies in the memory system. Additionally, the density/performance configuration changes can be performed dynamically with configuration commands.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A flash memory system comprising:
    a processor for generating density configuration bits for the memory system, the processor configured to generate the density configuration bits in response to reading data that indicate a function of the memory and not a particular memory density and the processor further configured to access a table in memory that stores the density configuration with an associated function of the memory; and
    a plurality of flash memory dies coupled to the processor, each die having selectable density configurations and comprising:
        a flash memory array comprising a plurality of memory cells that are organized into predetermined sets of memory cells, each memory cell capable of storing a selectable quantity of data bits;
        control circuitry, coupled to the memory array and the processor, that configures the density configurations for the predetermined sets of memory cells in response to the density configuration bits and the table;
        a non-volatile configuration register, coupled to the control circuitry, for storing the density configuration bits; and
        a volatile configuration register, coupled to the non-volatile configuration register, that receives the density configuration bits from the non-volatile configuration register.

2. The memory system of claim 1 wherein the control circuitry is a state machine.

3. The memory system of claim 1 wherein the predetermined sets of memory cells are blocks of memory cells.

4. The memory system of claim 1 wherein the non-volatile configuration register is a plurality of non-volatile fuses.

5. The memory system of claim 1 wherein the volatile configuration register is random access memory.

6. The memory system of claim 5 wherein the volatile configuration register is adapted to be loaded from a predetermined row of the memory array.

7. The memory system of claim 1 wherein the density configuration bits are generated in response to user input.

8. The memory system of claim 1 wherein the selectable quantity of data bits includes a plurality of data bits.

9. A flash memory system comprising:
    a processor for generating a density configuration for the memory system in response to a user input that does not include memory density configuration data, the processor configured to read a table in memory that stores the density configuration with each associated user input; and
    a plurality of flash memory dies coupled to the processor, each die comprising:
        a flash memory array comprising a plurality of memory cells that are organized into memory blocks, each memory block capable of storing a selectable quantity of data bits; and
        control circuitry, coupled to the memory array and the processor, that selects the quantity of data bits in response to the density configuration generated from the table in memory.

10. The memory system of claim 9 wherein the user input comprises a mean time before failure.

11. The memory system of claim 9 wherein the user input comprises an average access speed.

12. The memory system of claim 9 wherein the user input comprises a function of the memory system.

13. The memory system of claim 12 wherein the function comprises one of storing photographs or computer code.

14. The memory system of claim 9 and further including random access memory coupled to the processor into which the control circuitry moves the performance configuration.

15. A method for configuring memory density of a memory array in a memory system, the memory system comprising a processor coupled to control circuitry, the method comprising:
    generating configuration data in response to user input that does not contain memory density configurations by reading a table in memory that comprises configuration data with each associated user input;
    storing the configuration data into a volatile configuration register;
    setting the memory density for at least a subset of the memory array in response to the configuration data; and
    storing the configuration data into a non-volatile configuration register in response to a power-down of the memory array.

16. The method of claim 15 wherein the configuration data is generated by the processor in response to the user input wherein the user input is composed of one of: average memory access speed and mean time before failure of the memory array.

17. The method of claim 16 wherein the configuration data is transferred to the control circuitry for storing into the configuration register.

18. The method of claim 15 wherein the subset of the memory array is a memory block.

19. A method for configuring the performance of a memory system, the memory system comprising a processor, a plurality of memory arrays organized into memory blocks, a configuration register, and control circuitry coupled to the plurality of memory arrays for controlling read and write operations, the method comprising:
    receiving a performance parameter that does not include memory density configuration data;
    generating configuration data in response to the performance parameter by reading a table in memory that contains the configuration data each with an associated performance parameter;
    loading the configuration data into the configuration register; and
    configuring the performance of the memory system by adjusting, in response to the configuration data, memory density of the memory blocks.

20. The method of claim 19 wherein the performance parameter is an average memory access speed.

21. The method of claim 19 wherein the performance parameter is a reliability of data stored in the plurality of memory arrays.

22. The method of claim 19 wherein the processor receives the performance parameter and generates the configuration data for use by the control circuitry.

23. A method for configuring memory density of a plurality of memory arrays in a memory system, the plurality of memory arrays each comprise a plurality of memory cells organized into memory blocks, the method comprising:
    receiving a performance parameter that does not include a memory density configuration;
    generating a memory operation command in response to the performance parameter wherein the memory operation command is read from a table in memory that includes the performance parameter stored with an associated memory operation command;

determining if the memory operation command contains a memory density configuration; and executing the memory operation command on memory blocks designated by the memory density configuration.

24. The method of claim 23 and further including:

if the command contains the memory density configuration, performing either the read or the write operation at the density specified in the command; and if the command does not contain the memory density configuration, performing the read or the write operation as a single bit per cell operation.

25. The method of claim 23 wherein the memory density configuration comprises one of a single bit per cell configuration or a multiple level cell configuration.

26. The method of claim 25 wherein the multiple level cell configuration comprises storing a plurality of bits on one memory cell.

27. A method for configuring the density of a plurality of memory arrays in a flash memory system, the memory arrays each comprising a plurality of NAND flash memory cells organized as a plurality of memory blocks, each memory array coupled to corresponding control circuitry that is coupled to a corresponding configuration register having a plurality of configuration bits that each indicate the density of a corresponding memory block, the method comprising:

generating a configuration bit for each memory block in response to received performance parameters wherein the performance parameters do not include memory density configuration data wherein the configuration bit is read from a table in memory that stores performance parameters each with an associated configuration bit;

loading the configuration bits into their corresponding configuration registers;

generating a command to perform one of a read or a write operation on a first memory block of the plurality of memory blocks;

reading the configuration bit corresponding to the first memory block; and executing the command on the first memory block in response to the configuration bit.

28. The method of claim 27 wherein loading the configuration bits comprises loading the configuration bits from a first row of each memory array corresponding with the configuration register to be loaded.

29. The method of claim 27 wherein if the configuration bit is a logical 1, performing a high density read or high density write operation in response to the command.

30. The method of claim 27 wherein if the configuration bit is a logical 0, performing a single density read or single density write operation in response to the command.

31. A method for configuring memory density of a memory array in a memory system, the method comprising:

receiving data indicating a use for the memory system, the received data indicating the use does not comprise memory density configuration data;

generating memory density configuration data for at least a subset of the memory array in response to the data indicating the use by accessing a table in memory that stores the use for the memory system each with associated memory density configuration data; and configuring the memory density for at least a subset of the memory array in response to the memory density configuration data.

32. The method of claim 31 and further including requesting the data indicating the use for the memory system.

33. The method of claim 31 wherein the memory system is a memory card and the use for the memory system includes one of photograph storage or code storage.

34. The method of claim 33 wherein the memory density for photograph storage use is greater than the memory density for code storage use.

35. The method of claim 31 wherein the configuration data is stored in a configuration register.

36. The method of claim 31 wherein the configuration data is used to generate a memory operation command.

37. The method of claim 36 wherein the memory operation command comprises one of a high density write command, a high density read command, a single density write command, or a single density read command.

38. A memory system comprising:

a processor for generating memory control signals and receiving memory system use data that does not include memory density configuration data, the processor configured to read a table in memory that stores memory system use data with an associated memory control signal; and a flash memory device coupled to the processor, the device having selectable density configurations, the device comprising:

a memory array comprising a plurality of memory cells, each memory cell capable of storing a selectable quantity of data bits; and control circuitry, coupled to the memory array, that selects the density configuration in response to the memory control signals from the table in memory.

39. The system of claim 38 wherein the control circuitry selects a first density configuration in response to the memory system use data indicating photograph storage and a second density configuration in response to the memory system use data indicating code storage wherein the first density configuration is greater than the second density configuration.

40. The system of claim 38 wherein the processor is adapted to generate a request for the memory system use data.

41. The system of claim 38 wherein the control circuitry is adapted to configure, in response to the memory system use data, a first predetermined quantity of memory cells to a multiple level cell configuration and a second predetermined quantity of memory cells to a single bit per cell configuration.

* * * * *

UNITED STATES PATENT AND TRADEMARK OFFICE
CERTIFICATE OF CORRECTION

| | |
|---|---|
| PATENT NO. | : 7,535,759 B2 |
| APPLICATION NO. | : 10/861645 |
| DATED | : May 19, 2009 |
| INVENTOR(S) | : Frankie F. Roohparvar |

Page 1 of 1

It is certified that error appears in the above-identified patent and that said Letters Patent is hereby corrected as shown below:

On the Title page, in field (56), under "U.S. Patent Documents", in column 2, line 5, after "6,662,285 B1 12/2003" delete "Sastry" and insert -- Douglass et al. --, therefor.

Signed and Sealed this

Twenty-eighth Day of July, 2009

JOHN DOLL
*Acting Director of the United States Patent and Trademark Office*